(12) United States Patent
Okawara et al.

(10) Patent No.: US 8,199,442 B2
(45) Date of Patent: Jun. 12, 2012

(54) ELECTRICAL CONNECTING STRUCTURE FOR PIEZOELECTRIC ELEMENT, PIEZOELECTRIC ACTUATOR, HEAD SUSPENSION, AND ELECTRICAL CONNECTING STRUCTURE FOR CONDUCTIVE PART

(75) Inventors: Osamu Okawara, Aikoh-gun (JP); Toshiki Ando, Aikoh-gun (JP); Naoki Moriya, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 302 days.

(21) Appl. No.: 12/584,627

(22) Filed: Sep. 8, 2009

(65) Prior Publication Data
US 2010/0067151 A1 Mar. 18, 2010

(30) Foreign Application Priority Data
Sep. 8, 2008 (JP) .................. 2008-229284

(51) Int. Cl.
G11B 21/10 (2006.01)
(52) U.S. Cl. .................... 360/294.4
(58) Field of Classification Search ............... 360/294.4
See application file for complete search history.

(56) References Cited

U.S. PATENT DOCUMENTS 6,791,783 B2 * 9/2004 Nakagawa .................. 360/75
6,927,947 B2 * 8/2005 Shimizu et al. ............. 360/294.4
7,167,344 B2 * 1/2007 Nakagawa et al. ......... 360/294.4
7,218,481 B1 * 5/2007 Bennin et al. .............. 360/294.4
7,280,319 B1 * 10/2007 McNab ....................... 360/294.4
7,359,158 B2 * 4/2008 Takikawa et al. ........... 360/244.8
7,440,236 B1 * 10/2008 Bennin et al. .............. 360/294.4

FOREIGN PATENT DOCUMENTS
JP 2002-50140 2/2002
JP 2002-184140 6/2002
JP 2003-061371 2/2003

* cited by examiner

*Primary Examiner* — Mark Blouin
(74) *Attorney, Agent, or Firm* — Jordan and Hamburg LLP

(57) ABSTRACT

A piezoelectric element 13 has a common electrode 19 that receives electricity from a terminal 57. The terminal 57 has a through hole 67 and an electric insulating layer 61. The piezoelectric element 13 is arranged so that the common electrode 19 faces the electric insulating layer 61 of the terminal 57. A liquid stopper 69 is formed around the through hole 67 so as to come between the common electrode 19 and the terminal 57 when the common electrode 19 and terminal 57 are set to face each other. A liquid conductive adhesive 71 is injected into the through hole 67 to fill a gap defined by the liquid stopper 69 between the terminal 57 and the common electrode 19 and secure electric connection between the terminal 57 and the common electrode 19.

This configuration improves the reliability of wiring to the piezoelectric element and prevents the piezoelectric element from being damaged.

16 Claims, 15 Drawing Sheets

External view of wiring member seen from bottom of head suspension

External view of wiring member seen from piezoelectric element

Front view

Right side view

Sectional view of electrical connecting structure

Front view

Sectional view of electrical connecting structure

Front view

Sectional view of electrical connecting structure

Front view

Right side view

Sectional view of electrical connecting structure

External view of wiring member seen from bottom of head suspension

External view of wiring member seen from piezoelectric element

Front view

Right side view

Sectional view of electrical connecting structure

Front view

Sectional view of electrical connecting structure

Front view

Sectional view of electrical connecting structure

Front view

Right side view

Sectional view of electrical connecting structure

ELECTRICAL CONNECTING STRUCTURE FOR PIEZOELECTRIC ELEMENT, PIEZOELECTRIC ACTUATOR, HEAD SUSPENSION, AND ELECTRICAL CONNECTING STRUCTURE FOR CONDUCTIVE PART

BACKGROUND OF THE INVENTION

1. Field of the Invention

The present invention relates to a head suspension for supporting a magnetic head slider in a magnetic disk drive. In particular, the present invention relates to a piezoelectric actuator having a piezoelectric element that deforms in response to an applied voltage, to minutely move the magnetic head slider in a widthwise direction of the head suspension.

2. Description of Related Art

Small-sized, precision information devices are rapidly advancing and needs for micro-actuators capable of conducting positioning control for very small distances are increasing. Such micro-actuators are highly needed by, for example, optical systems for correcting focuses and inclination angles, ink jet printers for controlling ink heads, and magnetic disk drives for controlling magnetic heads.

The magnetic disk drives have an urgent issue to solve, i.e., increasing storage capacity. The storage capacity of a magnetic disk drive usually increases if the storage capacity of each magnetic disk contained in the magnetic disk drive increases. The storage capacity or recording density of a magnetic disk will increase, without changing the diameter thereof, if the number of tracks per inch (TPI) on the magnetic disk increases. For this, the width of each track on the magnetic disk must be narrow. To handle such narrow tracks on the magnetic disk, a magnetic head of a head suspension installed in the magnetic disk drive must conduct a precise positioning operation in a direction across the tracks. For realizing the precise positioning operation, there is a need of an actuator capable of accurately moving and positioning the magnetic head in a very small area.

To meet the need, the applicant of the present invention has proposed in Japanese Unexamined Patent Application Publication No. 2002-184140 a head suspension for a disk drive, including a base plate, a connection plate having a hinge thinner than the base plate, a load beam provided with a flexure and a magnetic head, and a pair of piezoelectric elements.

This related art employs a dual actuator system that involves, for a positioning purpose, a voice coil motor and the piezoelectric elements made of PZT (lead zirconate titanate). The piezoelectric elements minutely drive a front end of the load beam in a widthwise direction (sway direction) of the head suspension. Compared with a single actuator system employing only a voice coil motor, the dual actuator system employing the voice coil motor and piezoelectric elements more precisely positions the magnetic head attached to the front end of the head suspension.

An important issue for the head suspension employing the dual actuator system is how to supply electricity to the piezoelectric elements.

A technique to approach this issue is disclosed in Japanese Unexamined Patent Application Publication No. 2003-61371 (in particular, FIGS. 9 and 10 thereof). This related art arranges a pair of wires on a head suspension. One of the wires is connected through wire bonding to a base electrode and the other wire is connected through wire bonding to an exposed part of the top face of each piezoelectric element.

This related art has a risk of cracking the piezoelectric element because the wire bonding process applies a local stress on the piezoelectric element to secure a bonding strength. If the wire bonding process is carried out with a reduced force not to crack the piezoelectric element, the bonding strength will be insufficient to deteriorate the reliability of electric connection to the piezoelectric element. It is very difficult to carry out the wire bonding process on piezoelectric elements to satisfy both the productivity and reliability of the piezoelectric elements.

SUMMARY OF THE INVENTION

An object of the present invention is to provide an electrical connecting structure for a piezoelectric element, capable of providing the piezoelectric element with electrical connection without deteriorating the productivity and reliability of the piezoelectric element. Also provided by the present invention are a piezoelectric actuator employing the piezoelectric element, a head suspension employing the piezoelectric actuator, and an electrical connecting structure for a conductive part.

In order to accomplish the objects, an aspect of the present invention provides an electrical connecting structure for a piezoelectric element, the piezoelectric element being incorporated in a piezoelectric actuator that is arranged between a base and a magnetic head and minutely moves the magnetic head in a sway direction according to a deformation of the piezoelectric element. The electrical connecting structure includes an electrode arranged on the piezoelectric element; a terminal having at least an electric insulating layer and wiring laid on the electric insulating layer, configured to supply electricity to the electrode; a through hole formed in the terminal through at least the electric insulating layer; a liquid stopper arranged around the through hole, the liquid stopper coming between the electrode and the terminal when the electrode and the terminal are set to face each other with the electric insulating layer being on the piezoelectric element side; and a liquid conductive adhesive injected into the through hole, to electrically connect the electrode and the wiring to each other.

This aspect arranges the liquid stopper around the through hole, positions the electrode and terminal with the electric insulating layer being on the piezoelectric element side and the liquid stopper being between the electrode and the terminal, and injects the liquid conductive adhesive into the through hole to electrically connect the electrode and the wiring to each other.

This aspect correctly accomplishes wiring to the piezoelectric element without damaging the piezoelectric element or deteriorating the reliability thereof.

BRIEF DESCRIPTION OF THE DRAWINGS

FIGS. 5A and 5B are views illustrating the details of wiring and a terminal applicable to the head suspension of FIG. 4, in which FIG. 5A is a view seen from the back of the head suspension and FIG. 5B is a view seen from the piezoelectric actuator;

FIGS. 6A, 6B, and 6C are views illustrating a first example of an electrical connecting structure applicable to the terminal of FIGS. 5A and 5B, in which FIG. 6A is a front view seen from the piezoelectric element, FIG. 6B is a right side view, and FIG. 6C is a sectional view taken along a line B-B of FIG. 4;

FIGS. 7A and 7B are views illustrating a second example of an electrical connecting structure applicable to the terminal of FIGS. 5A and 5B, in which FIG. 7A is a front view seen from the piezoelectric element and FIG. 7B is a sectional view taken along the line B-B of FIG. 4;

FIGS. 8A and 8B are views illustrating a third example of an electrical connecting structure applicable to the terminal of FIGS. 5A and 5B, in which FIG. 8A is a front view seen from the piezoelectric element and FIG. 8B is a sectional view taken along the line B-B of FIG. 4;

FIGS. 9A, 9B, and 9C are views illustrating a fourth example of an electrical connecting structure applicable to the terminal of FIGS. 5A and 5B, in which FIG. 9A is a front view seen from the piezoelectric element, FIG. 9B is a right side view, and FIG. 9C is a sectional view taken along the line B-B of FIG. 4;

FIGS. 10A and 10B are views illustrating the details of another wiring and terminal applicable to the head suspension of FIG. 4, in which FIG. 10A is a view seen from the back of the head suspension and FIG. 10B is a view seen from the piezoelectric actuator;

FIGS. 11A, 11B, and 11C are views illustrating a fifth example of an electrical connecting structure applicable to the terminal of FIGS. 10A and 10B, in which FIG. 11A is a front view seen from the piezoelectric element, FIG. 11B is a right side view, and FIG. 11C is a sectional view taken along a line B-B of FIG. 4;

FIGS. 12A and 12B are views illustrating a sixth example of an electrical connecting structure applicable to the terminal of FIGS. 10A and 10B, in which FIG. 12A is a front view seen from the piezoelectric element and FIG. 12B is a sectional view taken along the line B-B of FIG. 4;

FIGS. 13A and 13B are views illustrating a seventh example of an electrical connecting structure applicable to the terminal of FIGS. 10A and 10B, in which FIG. 13A is a front view seen from the piezoelectric element and FIG. 13B is a sectional view taken along the line B-B of FIG. 4;

FIGS. 14A, 14B, and 14C are views illustrating an eighth example of an electrical connecting structure applicable to the terminal of FIGS. 10A and 10B, in which FIG. 14A is a front view seen from the piezoelectric element, FIG. 14B is a right side view, and FIG. 14C is a sectional view taken along the line B-B of FIG. 4.

DETAILED DESCRIPTION OF EMBODIMENTS

Electrical connecting structures for piezoelectric elements, piezoelectric actuators, head suspensions, and electrical connecting structures for conductive parts according to embodiments of the present invention will be explained with reference to the drawings.

First, a head suspension according to an embodiment of the present invention will be explained.

Figure 1:
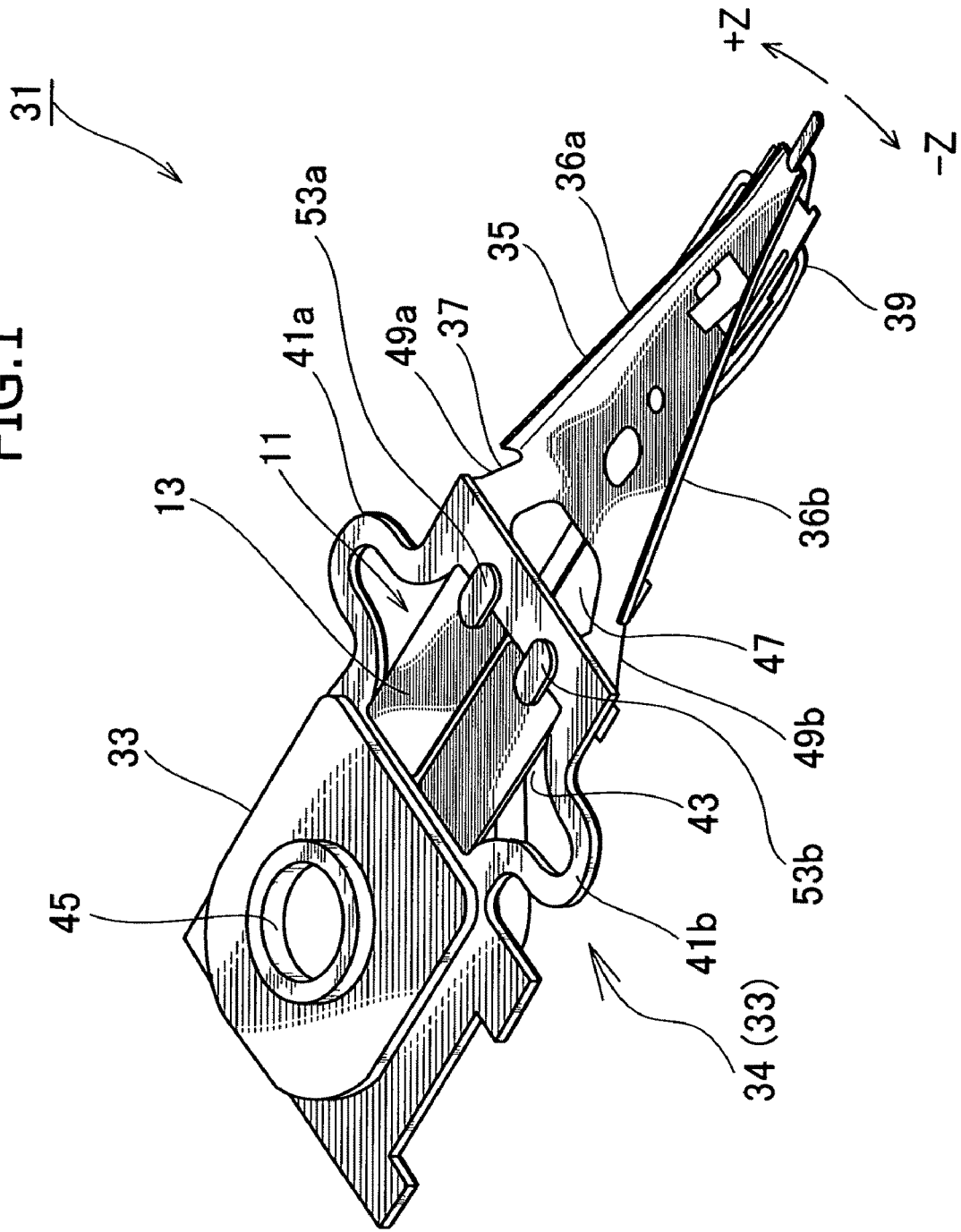
FIG. 1 is a perspective view illustrating a head suspension according to an embodiment of the present invention.

FIG. 1 is a perspective view illustrating a head suspension according to an embodiment of the present invention.

The head suspension 31 includes a base plate 33 to which a piezoelectric actuator 11 consisting of a piezoelectric element 13 is attached, a load beam 35, a connection plate 37 functioning as a hinge, and the like. The base plate 33 has an opening 43 in which the piezoelectric element 13 is arranged. The piezoelectric element 13 deforms in response to an applied voltage, to move a front end of the load beam 35 in a sway direction, i.e., a widthwise direction of the head suspension 31.

The base plate 33 is made of, for example, a stainless steel thin plate having a thickness of about 150 to 200 μm. The base plate 33 includes a pair of flexible parts 41a and 41b each having a U-shape, the opening 43 for accommodating the piezoelectric element 13, and a circular boss 45. The flexible parts 41a and 41b each are outwardly curved at a location corresponding to a side face of the piezoelectric element 13. The base plate 33 is fixed to a front end of an actuator arm (not illustrated) that is driven and turned by a voice coil motor (not illustrated).

The base plate 33 may be made of light metal such as aluminum alloy and a clad material consisting of light metal and stainless steel. The light metal may reduce the inertia of the base plate 33, increase the resonant frequency of the head suspension 31 in a sway direction, and improve the tracing performance of the head suspension 31.

Instead of providing the base plate 33 with the flexible parts 41a and 41b and opening 43, an actuator plate 34 having the flexible parts 41a and 41b and opening 43 may be used. In this case, a rear end of the actuator plate 34 is laid on the base plate 33 and is fixed thereto by, for example, laser welding. According to the present invention, the head suspension 31 may employ both the base plate 33 and actuator plate 34, or the base plate 33 alone. In the following explanation, the actuator plate 34 is considered to be integral with the base plate 33, for the sake of simplicity of explanation.

The load beam 35 has a flexure 39. The flexure 39 is made of a metal thin plate spring that is thinner and more precise than the load beam 35. A front end of the flexure 39 is provided with a slider (not illustrated) having a magnetic head. The load beam 35 is made of a stainless steel plate having a thickness of about 30 to 150 μm and is designed to apply load onto the slider. The load beam 35 has bent edges 36a and 36b to improve the rigidity of the load beam 35. A rear end of the load beam 35 is integral with the connection plate 37. The load beam 35 may be made of light metal such as aluminum alloy and a clad material consisting of light metal and stainless steel. The light metal may reduce the inertia of the load beam 35, increase the resonant frequency of the head suspension 31 in a sway direction, and improve the tracing performance of the head suspension 31.

The connection plate 37 is made of a resilient metal plate having a thickness of about 30 μm. A part of the connection plate 37 has a hole 47 to reduce the rigidity thereof in a thickness direction. On each side of the hole 47, there are hinges 49a and 49b that bend in the thickness direction. A rear end of the connection plate 37 is laid on a front end of a bottom face of the base plate 33 and is fixed thereto by, for example, laser welding.

The piezoelectric actuator 11 incorporated in the head suspension 31 will be explained.

Figure 2:
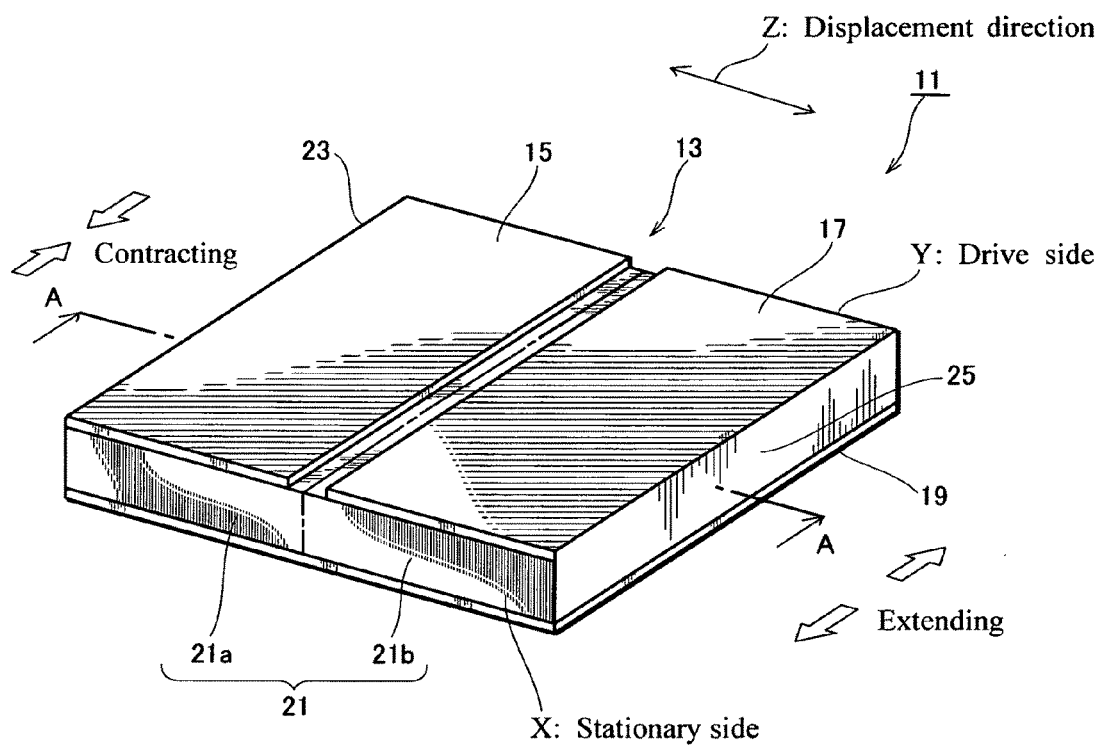
FIG. 2 is a perspective view illustrating a piezoelectric actuator arranged in the head suspension of FIG. 1.
Figure 3:
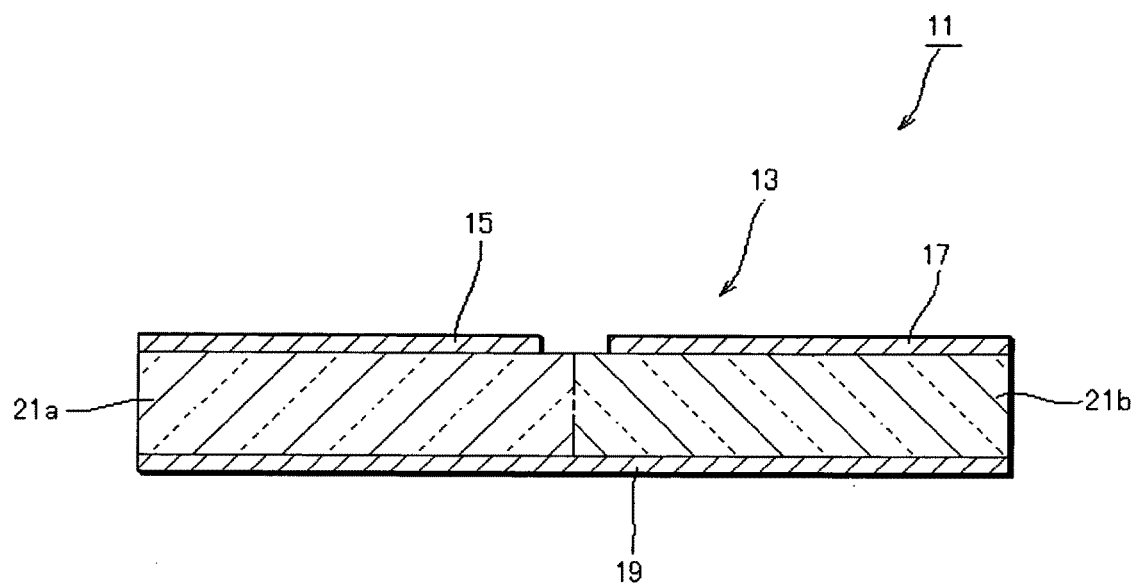
FIG. 3 is a sectional view taken along a line A-A of FIG. 2.

FIG. 2 is a perspective view illustrating the piezoelectric actuator 11 and FIG. 3 is a sectional view illustrating the same taken along a line A-A of FIG. 2.

The piezoelectric actuator 11 consists of the piezoelectric element 13 substantially having a rectangular shape. The piezoelectric element 13 deforms in response to an applied voltage, to drive a part (the load beam 35 according to the embodiment). More precisely, the piezoelectric element 13 deforms when a voltage is applied thereto, or when the voltage applied thereto is stopped, or according to the level of a voltage applied thereto.

The piezoelectric element 13 includes first and second electrodes 15 and 17 that are arranged in a common plane and are separated from each other by a predetermined distance, a common electrode (corresponding to "an electrode of a piezoelectric element" mentioned in Claims) opposing the first and second electrodes 15 and 17, and a piezoelectric material 21 arranged between the first and second electrodes 15 and 17 and the common electrode 19. The first and second electrodes 15 and 17 and common electrode 19 may be made of metal having a low contact resistance, such as gold (Au). The first and second electrodes 15 and 17 substantially have the same shape and size. The common electrode 19 is substantially equal in size and shape to a combination of the first and second electrodes 15 and 17.

The piezoelectric material 21 consists of a first piezoelectric material 21a that deforms according to a voltage applied to the first electrode 15 and a second piezoelectric material 21b that deforms according to a voltage applied to the second electrode 17. The first and second piezoelectric materials 21a and 21b are arranged so that they are oppositely polarized. The first and second piezoelectric materials 21a and 21b are made of, for example, piezoelectric ceramics that are polarized with a polarization direction difference of 180 degrees.

Operation of the piezoelectric actuator 11 will be explained. In FIG. 2, a side of the piezoelectric element 13 marked with "X" is a stationary side, a side marked with "Y" is a drive side, the first and second electrodes 15 and 17 are grounded, and the common electrode 19 receives an applied voltage.

When receiving the voltage, the piezoelectric element 13 deforms into a trapezoid with an end face 23 of the first electrode 15 contracting and an end face 25 of the second electrode 17 extending. As a result, the piezoelectric element 13 moves in a direction Z (FIG. 2) by a very small distance, to move the part (load beam 35) attached to the drive side Y of the piezoelectric element 13. When the common electrode 19 is grounded and the first and second electrodes 15 and 17 receive a voltage, the piezoelectric element 13 moves in a direction −Z (opposite to the direction Z of FIG. 2) by a minute distance, to move the part (load beam 35) attached to the drive side Y of the piezoelectric element 13.

The piezoelectric actuator 11 employed by the embodiment needs three electric systems for the first and second electrodes 15 and 17 and common electrode 19. This configuration simplifies wiring to the piezoelectric element 13 and secures the reliability thereof.

The embodiment employs the piezoelectric actuator 11 using the single piezoelectric element 13, to reduce the number of parts, minimize parts management, and reduce the cost of the head suspension 31.

The head suspension 31 will be explained further.

Figure 4:
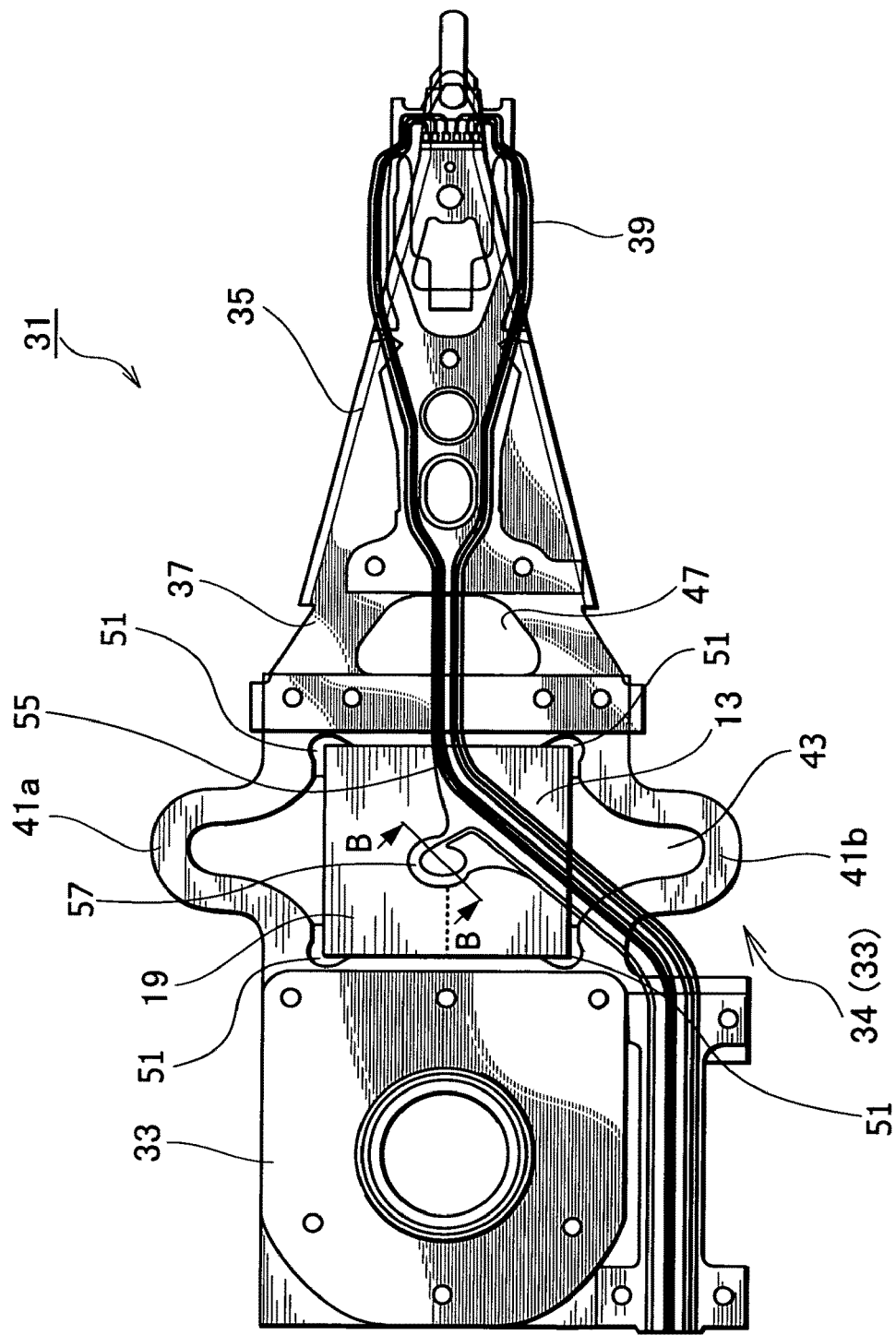
FIG. 4 is a back view illustrating the head suspension of FIG. 1.

FIG. 4 is a back view illustrating the head suspension 31.

In FIGS. 1 and 4, the opening 43 of the base plate 33 receives the piezoelectric element 13 with the first and second electrodes 15 and 17 being on top and the common electrode 19 being at the bottom. Front and rear edges of the opening 43 are partly etched so that the piezoelectric element 13 is firmly received in the opening 43.

Between the piezoelectric element 13 and the base plate 33, there is a nonconductive adhesive layer 51 having a proper thickness. The adhesive layer 51 is formed at the front and rear edges of the opening 43, to effectively transfer a deformation (displacement) of the piezoelectric element 13 to the load beam 35 and secure electric insulation between the common electrode 19 and the base plate 33. According to the embodiment, the base plate 33 and connection plate 37 overlap each other, the overlapping part being the drive side Y of the piezoelectric actuator 11.

Next, electrical connecting structures for the piezoelectric element 13 according to embodiments of the present invention will be explained.

Figure 5A:
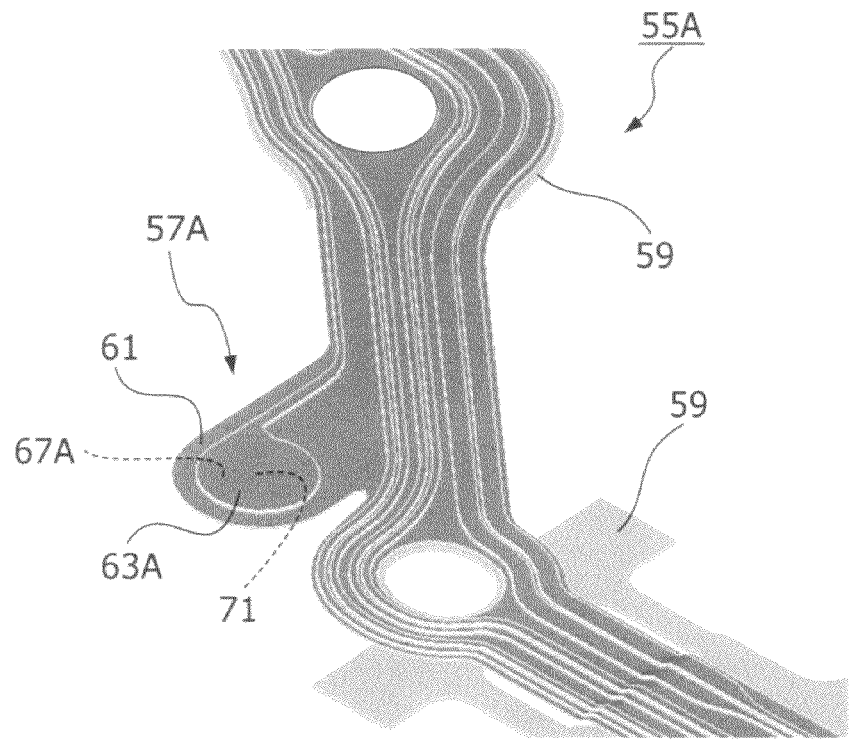
Figure 5B:
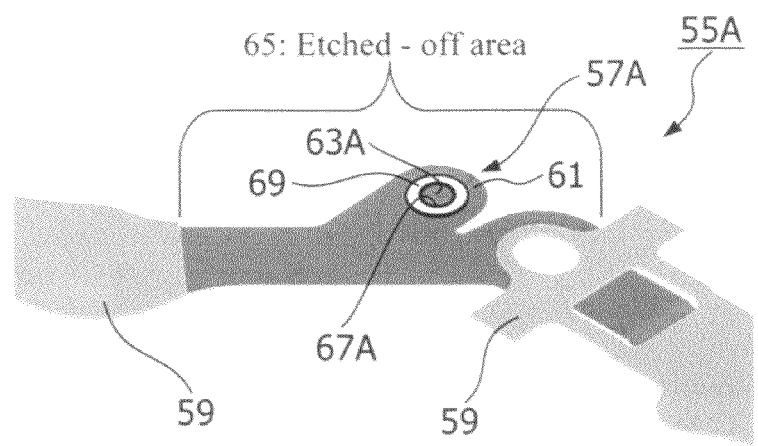
Figure 6A:
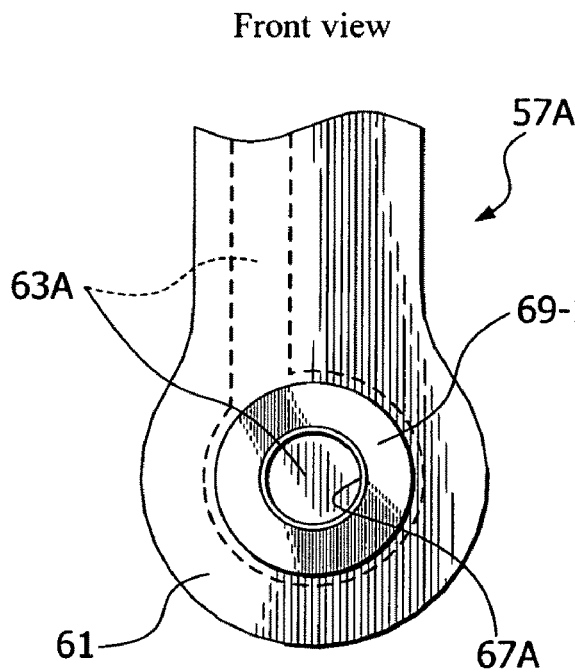
Figure 6B:
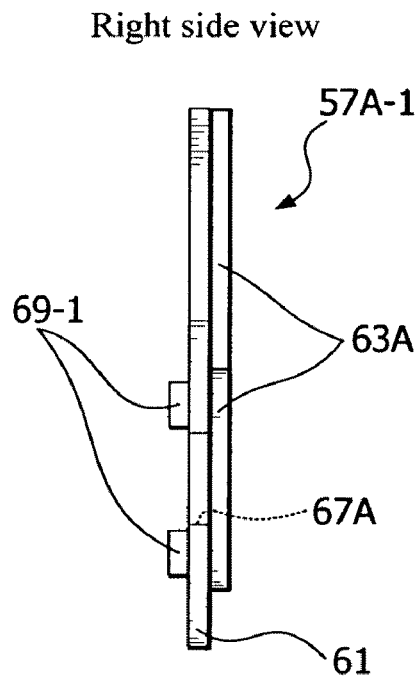
Figure 6C:
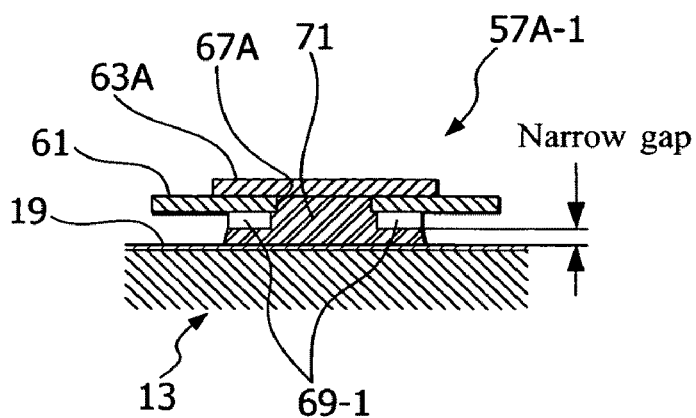
Figure 7A:
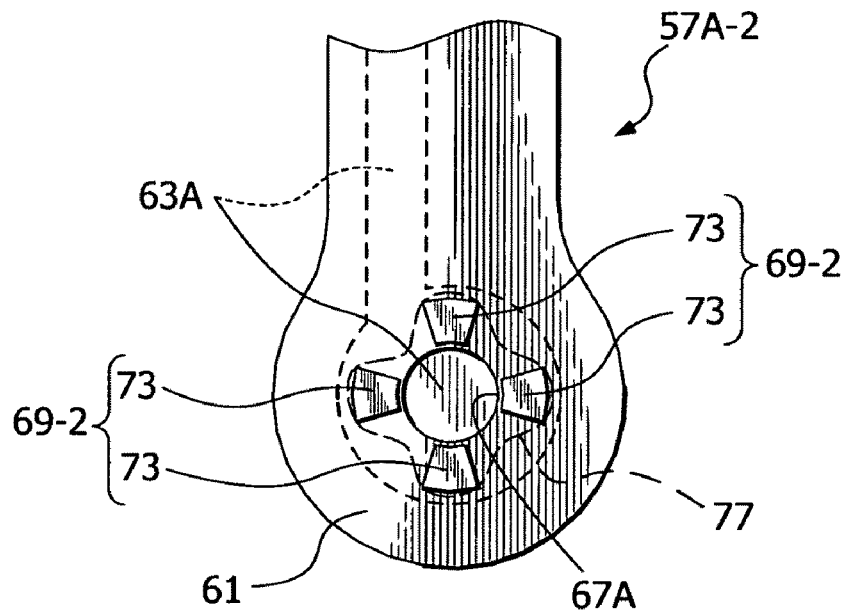
Figure 7B:
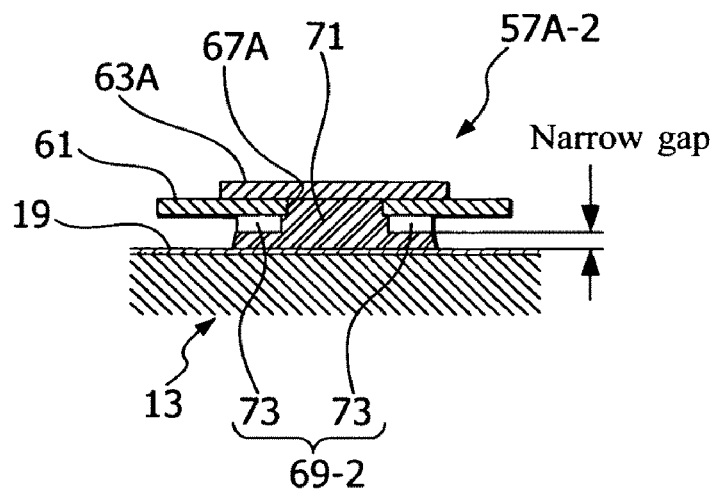
Figure 8A:
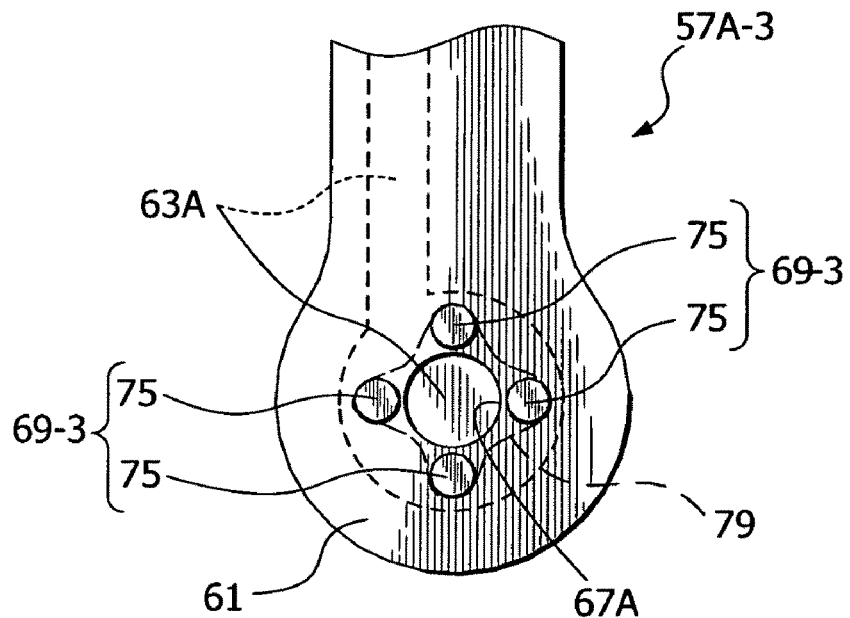
Figure 8B:
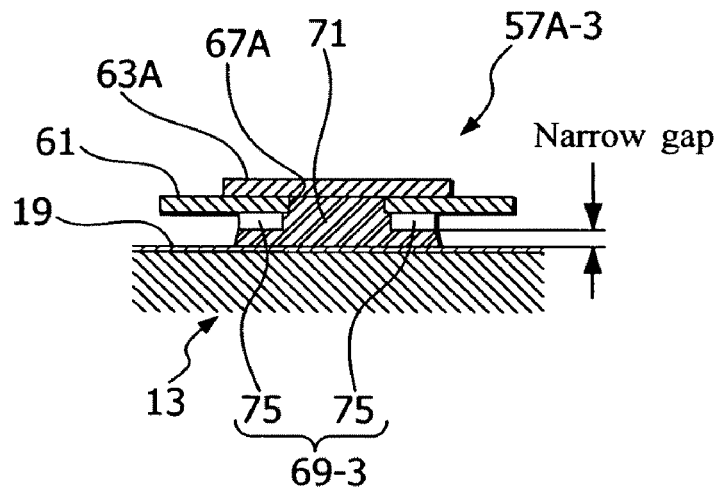
Figure 9A:
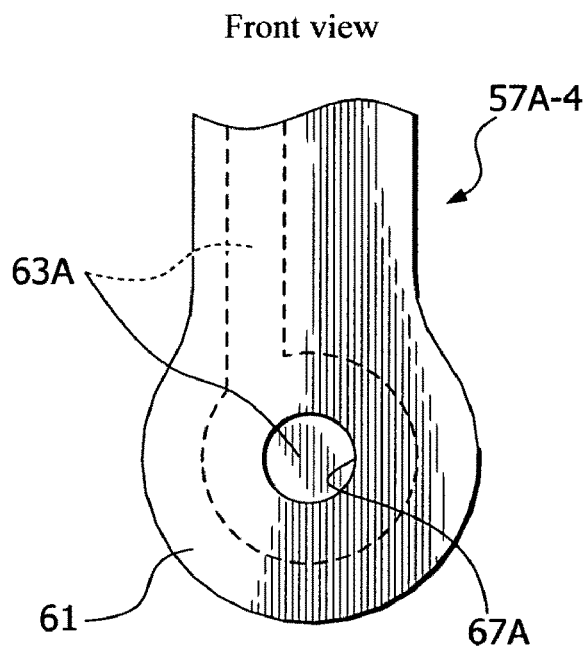
Figure 9B:
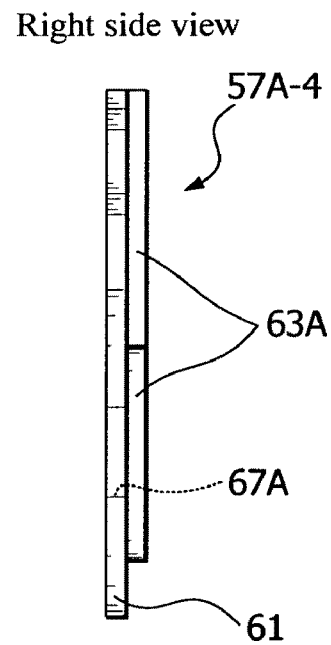
Figure 9C:
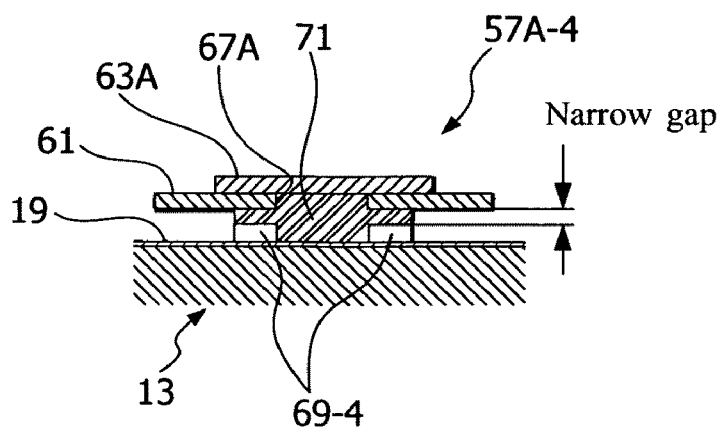
Figure 10A:
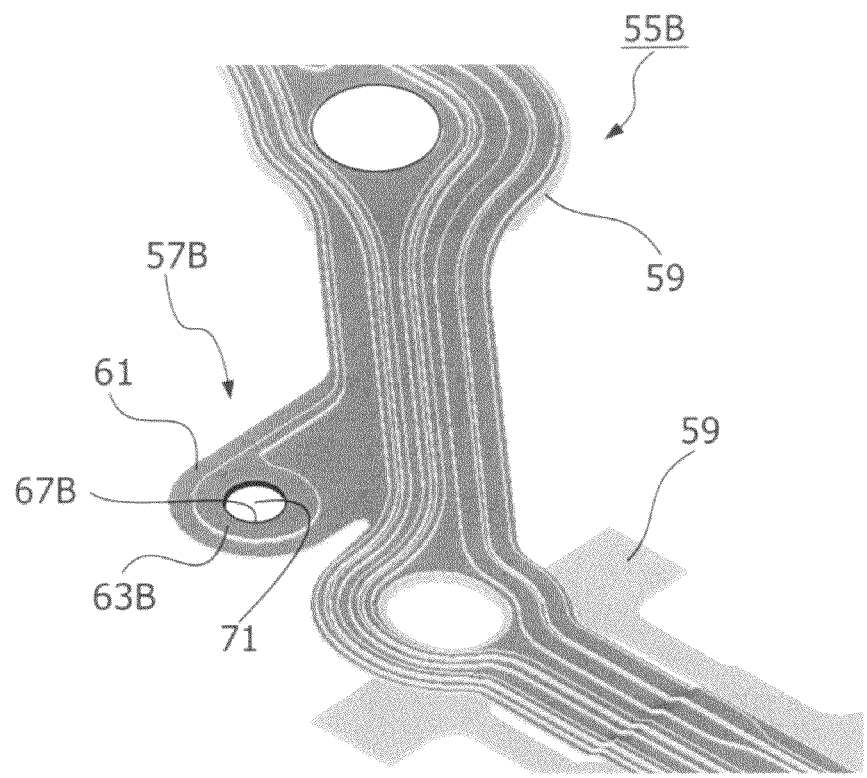
Figure 10B:
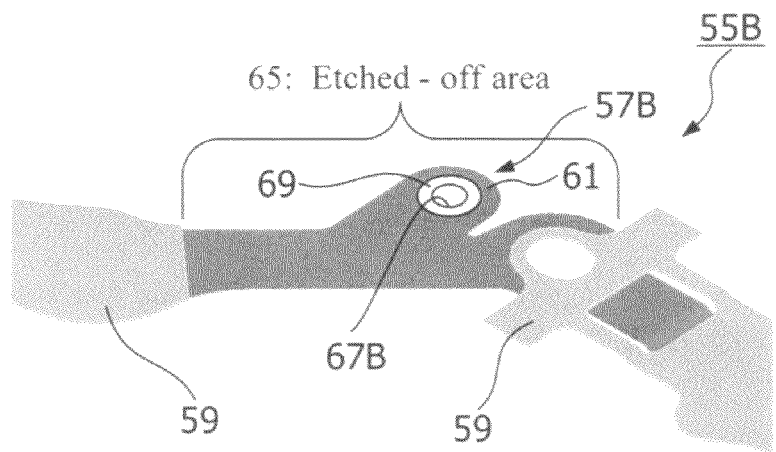
Figure 11A:
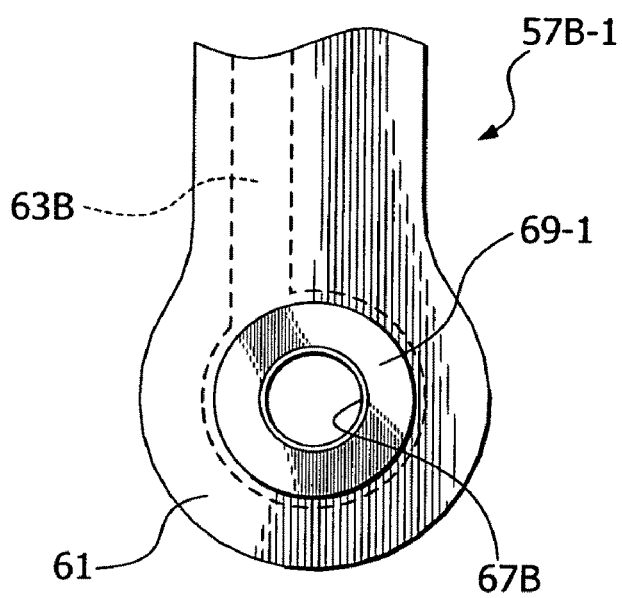
Figure 11B:
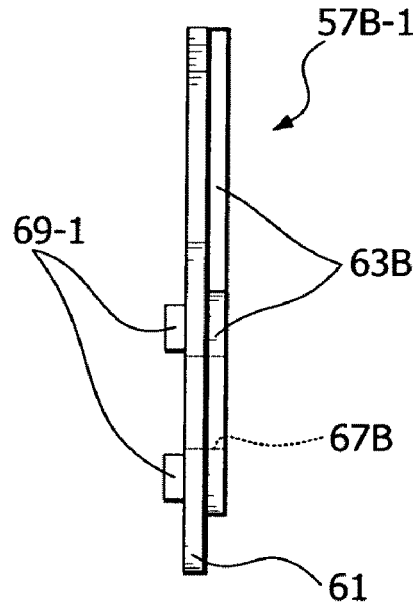
Figure 11C:
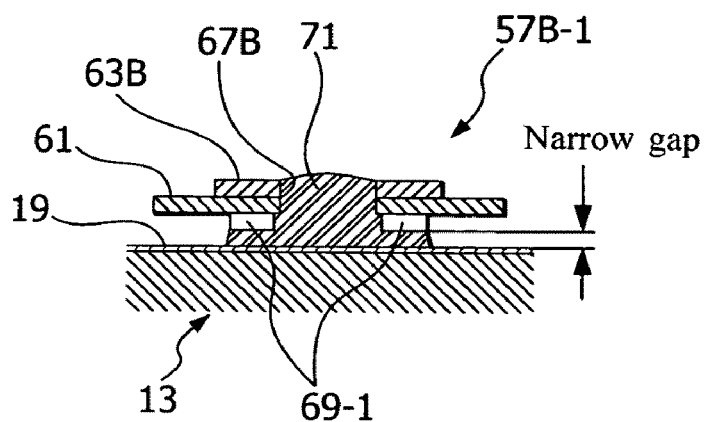
Figure 12A:
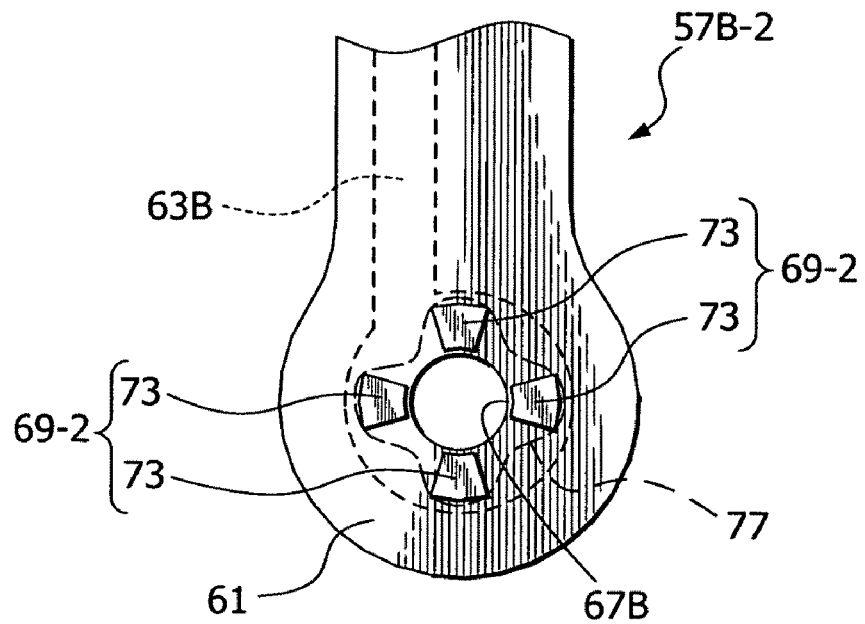
Figure 12B:
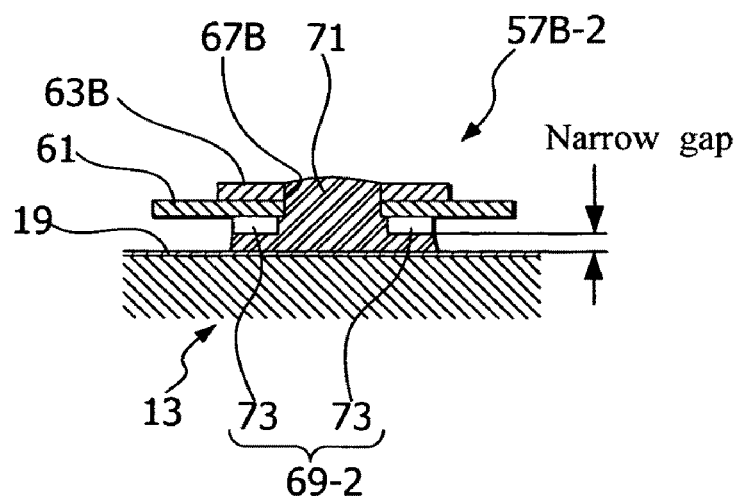
Figure 13A:
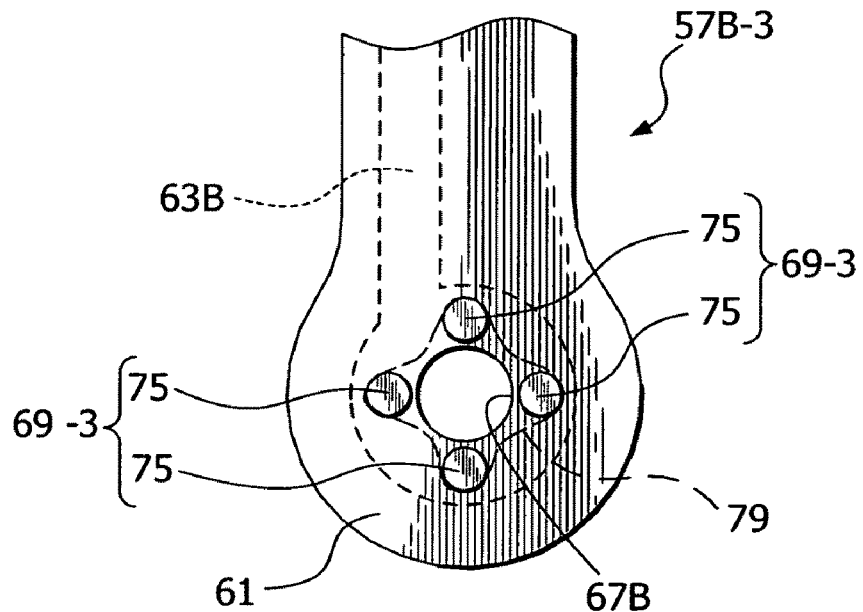
Figure 13B:
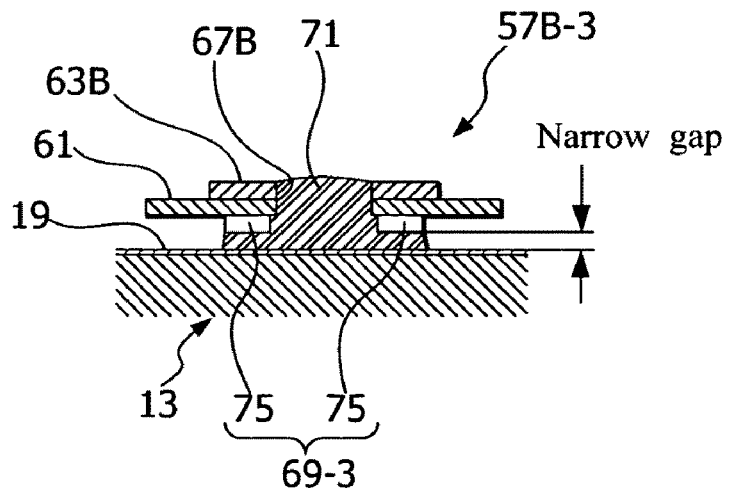
Figure 14A:
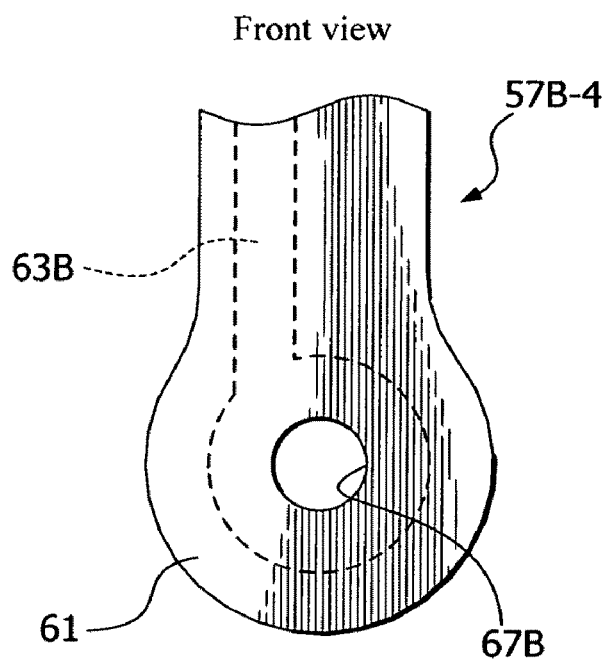
Figure 14B:
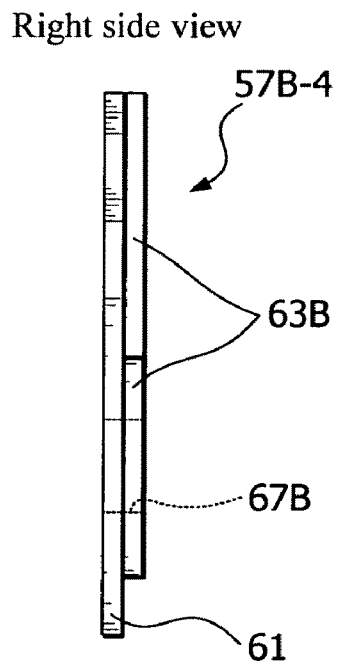
Figure 14C:
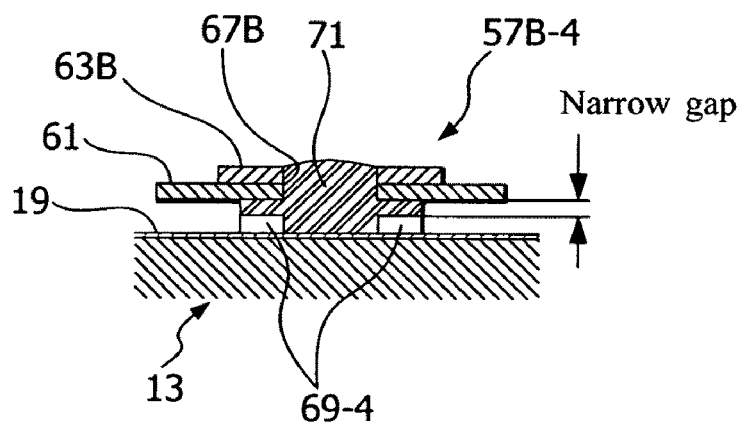

FIGS. 5A and 5B are views illustrating the details of a wiring member 55A (55 in FIG. 4) and a terminal 57A (57 in FIG. 4) applicable to the head suspension 31, in which FIG. 5A is a view seen from the back of the head suspension 31 and FIG. 5B is a view seen from the piezoelectric actuator 11, FIGS. 6A, 6B, and 6C are views illustrating a first electrical connecting structure example, in which FIG. 6A is a front view seen from the piezoelectric element 13, FIG. 6B is a right side view, and FIG. 6C is a sectional view taken along a line B-B of FIG. 4, FIGS. 7A and 7B are views illustrating a second electrical connecting structure example, in which FIG. 7A is a front view seen from the piezoelectric element 13 and FIG. 7B is a sectional view taken along the line B-B of FIG. 4, FIGS. 8A and 8B are views illustrating a third electrical connecting structure example, in which FIG. 8A is a front view seen from the piezoelectric element 13 and FIG. 8B is a sectional view taken along the line B-B of FIG. 4, FIGS. 9A, 9B, and 9C are views illustrating a fourth electrical connecting structure example, in which FIG. 9A is a front view seen from the piezoelectric element 13, FIG. 9B is a right side view, and FIG. 9C is a sectional view taken along the line B-B of FIG. 4, FIGS. 10A and 10B are views illustrating the details of a wiring member 55B (55 in FIG. 4) and a terminal 57B (57 in FIG. 4) applicable to the head suspension 31, in which FIG. 10A is a view seen from the back of the head suspension 31 and FIG. 10B is a view seen from the piezoelectric actuator 11, FIGS. 11A, 11B, and 11C are views illustrating a fifth electrical connecting structure example, in which FIG. 11A is a front view seen from the piezoelectric element 13, FIG. 11B is a right side view, and FIG. 11C is a sectional view taken along a line B-B of FIG. 4, FIGS. 12A and 12B are views illustrating a sixth electrical connecting structure example, in which FIG. 12A is a front view seen from the piezoelectric element 13 and FIG. 12B is a sectional view taken along the line B-B of FIG. 4, FIGS. 13A and 13B are views illustrating a seventh electrical connecting structure example, in which FIG. 13A is a front view seen from the piezoelectric element 13 and FIG. 13B is a sectional view taken along the line B-B of FIG. 4, and FIGS. 14A, 14B, and 14C are views illustrating an eighth electrical connecting structure example, in which FIG. 14A is a front view seen from the piezoelectric element 13, FIG. 14B is a right side view, and FIG. 14C is a sectional view taken along the line B-B of FIG. 4.

In the following explanation, like parts are represented with like reference numerals to omit repetition of explanation. Similar configurations will be explained such that a first appearing configuration is explained in detail and second and later appearing configurations are explained in the difference from the first appearing configuration. Similar parts such as terminals 57A and 57B are sometimes represented as "57" without the suffix, to generally cover "57A" and "57B".

When assembling the head suspension 31, the piezoelectric element 13 is positioned with respect to an inner circumferential face of the opening 43. In FIGS. 4, 5A, 5B, 10A, and 10B, the flexure 39 includes the wiring member 55 that supplies electricity to the piezoelectric element 13 and transmits read/write signals to and from the magnetic head. The wiring member 55 includes a terminal 57 that faces the common electrode 19 of the piezoelectric element 13. Between the terminal 57 and the common electrode 19, there is a gap of several tens of micrometers.

The terminal 57 illustrated in FIGS. 5A and 5B (FIGS. 10A and 10B) is provided with a basic form of the electrical connecting structure according to an embodiment of the present invention. The wiring member 55 consists of three layers including a conductive base 59 (the base of the flexure 39 made of SUS), an electric insulating layer 61 formed over the conductive base 59, and a wire (conductor) 63 such as a copper wire formed on the insulating layer 61. In an area 65 of the wiring member 55 that faces the common electrode 19 of the piezoelectric element 13, the conductive base 59 is removed by etching, to form the terminal 57 in the area 65 in such a way as to prevent a short-circuit failure between the common electrode 19 and the conductive base 59.

A small gap between the terminal 57 and the common electrode 19 of the piezoelectric element 13 is filled with the electrical connecting structure to secure electric connection between them. For this, the electrical connecting structure illustrated in FIGS. 5A and 5B that serves as a basis of the first to fourth electrical connecting structure examples of FIGS. 6A to 9C involves the common electrode 19 of the piezoelectric element 13, the terminal 57A to supply electricity to the common electrode 19, a through hole 67A formed through only the electric insulating layer 61, and a liquid stopper 69. The common electrode 19 and the terminal 57A are set so that the electric insulating layer 61 faces the piezoelectric element 13. The liquid stopper 69 is arranged around the through hole 67A between the common electrode 19 and the terminal 57A. A liquid conductive adhesive 71 is injected into the through hole 67A, to electrically connect the common electrode 19 of the piezoelectric element 13 and the wire (conductor) 63A to each other.

According to the electrical connecting structure illustrated in FIGS. 5A and 5B that serves as a basis of the first to fourth electrical connecting structure examples of FIGS. 6A to 9C, the through hole 67A is formed only in the electric insulating layer 61 of the terminal 57A. The wire (conductor) 63A has no hole, and therefore, the common electrode 19 and the wire 63A face each other through the hole 67A formed through the electric insulating layer 61.

The liquid stopper 69 arranged between the common electrode 19 and the terminal 57 narrows the gap between the common electrode 19 and the terminal 57 to produce a capillary phenomenon at the narrowed gap when the liquid conductive adhesive 71 is injected into the through hole 67.

The liquid stopper 69 may be made of any material such as metal and resin, if the material is harmless (not corrosive) to the conductive adhesive 71. The conductive adhesive 71 may be any proper adhesive such as a silver paste.

The first and second electrodes 15 and 17 of the piezoelectric element 13 are provided with conductive adhesives 53a and 53b (FIG. 1) to secure electric connection between the first and second electrodes 15 and 17 and the base plate 33.

The first example of the electrical connecting structure will be explained with reference to FIGS. 6A, 6B, and 6C. Between the common electrode 19 and a terminal 57A-1 (corresponding to the terminal 57 or 57A of FIGS. 4, 5A, and 5B), there is an annular liquid stopper 69-1 around the through hole 67A. The conductive adhesive 71 is injected into the through hole 67A, to electrically connect the common electrode 19 of the piezoelectric element 13 and the wire 63A to each other. The annular liquid stopper 69-1 is formed by leaving a part of the conductive base 59 of the wiring member 55 around the through hole 67A when etching off the conductive base 59 in the area 65 (FIG. 5B). At this time, the liquid stopper 69-1 must completely be insulated from the conductive base 59 that is present outside the area 65, to prevent a short-circuit failure between the common electrode 19 and the conductive base 59. The annular liquid stopper 69-1 may be a discrete part that is arranged around the through hole 67A after the conductive base 59 in the area 65 is completely etched off.

The second example of the electrical connecting structure will be explained with reference to FIGS. 7A and 7B. Between the common electrode 19 and a terminal 57A-2 (corresponding to the terminal 57 or 57A of FIGS. 4, 5A, and 5B), there is a liquid stopper 69-2 around the through hole 67A. The liquid stopper 69-2 consists of a plurality (four in FIG. 7A) of discrete segments 73 that are formed by radially cutting an annular material. The conductive adhesive 71 is injected into the through hole 67A, to electrically connect the common electrode 19 of the piezoelectric element 13 and the wire 63A to each other. The segments 73 may be formed by leaving parts of the conductive base 59 around the through hole 67A when etching off the conductive base 59 in the area 65 (FIG. 5B).

The third example of the electrical connecting structure will be explained with reference to FIGS. 8A and 8B. Between the common electrode 19 and a terminal 57A-3 (corresponding to the terminal 57 or 57A of FIGS. 4, 5A, and 5B), there is a liquid stopper 69-3 around the through hole 67A. The liquid stopper 69-3 consists of a plurality (four in FIG. 8A) of discrete segments 75 each having a dot-like shape. The conductive adhesive 71 is injected into the through hole 67A, to electrically connect the common electrode 19 of the piezoelectric element 13 and the wire 63A to each other. The segments 75 may be formed by leaving parts of the conductive base 59 around the through hole 67A when etching off the conductive base 59 in the area 65.

The fourth example of the electrical connecting structure will be explained with reference to FIGS. 9A, 9B, and 9C. Unlike the terminal 57A-1 illustrated in FIGS. 6A, 6B, and 6C in which the annular liquid stopper 69-1 is in contact with the electric insulating layer 61, a liquid stopper 69-4 for a terminal 57A-4 (corresponding to the terminal 57 or 57A of FIGS. 4, 5A, and 5B) is in contact with the common electrode 19 of the piezoelectric element 13.

The fifth to eighth examples of electrical connecting structure will be explained with reference to FIGS. 10A to 14C.

In FIGS. 10A and 10B, a small gap between the terminal 57B and the common electrode 19 of the piezoelectric element 13 is filled with the electrical connecting structure to secure electric connection between them. For this, the electrical connecting structure illustrated in FIGS. 10A and 10B that serves as a basis of the fifth to eighth electrical connecting structure examples of FIGS. 11A to 14C involves the common electrode 19 of the piezoelectric element 13, the terminal 57B to supply electricity to the common electrode 19, a through hole 67B formed through the electric insulating layer 61 and the wire (conductor) 63B, and a liquid stopper 69. The common electrode 19 and terminal 57B are set so that the electric insulating layer 61 faces the piezoelectric element 13. The liquid stopper 69 is arranged around the through hole 67B between the common electrode 19 and the terminal 57B. A liquid conductive adhesive 71 is injected into the through hole 67B, to electrically connect the common electrode 19 of the piezoelectric element 13 and the wire (conductor) 63B to each other.

Unlike the basic example illustrated in FIGS. 5A and 5B that forms the through hole 67A only in the electric insulating layer 61 of the terminal 57A, the basic example illustrated in FIGS. 10A and 10B forms the through hole 67B in the electric insulating layer 61 and the wire 63B of the terminal 57B, so that the common electrode 19 faces an inner circumference of the hole of the wire 63B through the hole 67B formed through the electric insulating layer 61 and the wire 63B.

The purpose and material of the liquid stopper 69 of the fifth to eighth examples are the same as those of the first to fourth examples.

The fifth example of the electrical connecting structure will be explained with reference to FIGS. 11A, 11B, and 11C. A terminal 57B-1 (corresponding to the terminal 57 or 57B of FIGS. 4, 10A, and 10B) of this example differs from the terminal 57A-1 of the first example of FIGS. 6A, 6B, and 6C in that the terminal 57B-1 involves the through hole 67B formed through the electric insulating layer 61 and the wire 63B. The remaining configuration of the fifth example including the annular liquid stopper 69-1 is the same as that of the first example.

The sixth example of the electrical connecting structure will be explained with reference to FIGS. 12A and 12B. A terminal 57B-2 (corresponding to the terminal 57 or 57B of FIGS. 4, 10A, and 10B) of this example differs from the terminal 57A-2 of the second example of FIGS. 7A and 7B in that the terminal 57B-2 involves the through hole 67B formed through the electric insulating layer 61 and the wire 63B. The remaining configuration of the sixth example including the liquid stopper 69-2 consisting of the regularly arranged segments 73 is the same as that of the second example.

The seventh example of the electrical connecting structure will be explained with reference to FIGS. 13A and 13B. A terminal 57B-3 (corresponding to the terminal 57 or 57B of FIGS. 4, 10A, and 10B) of this example differs from the terminal 57A-3 of the third example of FIGS. 8A and 8B in that the terminal 57B-3 involves the through hole 67B formed through the electric insulating layer 61 and the wire 63B. The remaining configuration of the seventh example including the liquid stopper 69-3 consisting of the regularly arranged dot-like segments 73 is the same as that of the third example.

The eighth example of the electrical connecting structure will be explained with reference to FIGS. 14A, 14B, and 14C. A terminal 57B-4 (corresponding to the terminal 57 or 57B of FIGS. 4, 10A, and 10B) of this example differs from the terminal 57A-4 of the fourth example of FIGS. 9A, 9B, and 9C in that the terminal 57B-4 involves the through hole 67B formed through the electric insulating layer 61 and the wire 63B. The remaining configuration of the eighth example including the annular liquid stopper 69-4 arranged on the common electrode 19 is the same as that of the fourth example.

Effects of the above-mentioned electrical connecting structures will be explained. According to the basic example illustrated in FIGS. 5A and 5B (FIGS. 10A and 10B) of the electrical connecting structure, the liquid stopper 69 is present between the common electrode 19 and the terminal 57. There is a narrow gap between the liquid stopper 69 and the common electrode 19. The narrow gap causes a capillary phenomenon when the conductive adhesive 71 is injected into the through hole 67, and therefore, the conductive adhesive 71 diffuses in the narrow gap.

A space between the terminal 57 and the common electrode 19 out of the liquid stopper 69 is wider than the narrow gap, and therefore, causes no capillary phenomenon and the conductive adhesive 71 never oozes into the space. Namely, the liquid stopper 69 stops the conductive adhesive 71 from spreading out of the liquid stopper 69. The periphery of the liquid stopper 69 acts like a bank to keep the adhesive within the periphery of the liquid stopper 69. Since the conductive adhesive 71 is contained within the narrow gap defined by the liquid stopper 69, the common electrode 19 of the piezoelectric element 13 and the terminal 57 are firmly joined together without applying mechanical stress onto the piezoelectric element 13 and the common electrode 19 and the wire 63 are surely electrically connected to each other.

This configuration allows wiring to the piezoelectric element 13 to be carried out without damaging the piezoelectric element 13, thereby securing the reliability thereof.

If the liquid stopper 69 is not present between the common electrode 19 and the terminal 57, the liquid conductive adhesive 71 injected into the through hole 67 freely penetrates into the space between the common electrode 19 and the terminal 57.

If this happens, 1) it is difficult to control the amount of the liquid conductive adhesive 71 to be injected into the through hole 67, i.e., it is difficult to automate the injecting work of the adhesive 71 into the through hole 67, 2) the rigidity balance of the head suspension 31 is destabilized to deteriorate the vibration characteristic thereof, and 3) the penetrated adhesive 71 will cause a short circuit between the electrode 19 of the piezoelectric element 13 and a conductive part that is present in the vicinity thereof.

On the other hand, the electrical connecting structure of FIGS. 5A and 5B according to the present invention arranges the liquid stopper 69 between the common electrode 19 and the terminal 57 to prevent the liquid conductive adhesive 71 injected into the through hole 67 from freely spreading into the space between the common electrode 19 and the terminal 57.

Accordingly, the present invention avoids the above-mentioned problems. Namely, the present invention is capable of 1) controlling the amount of the liquid conductive adhesive 71 to be injected into the through hole 67, to automate the injecting work of the liquid conductive adhesive 71 into the through hole 67, 2) securing a proper rigidity balance of the head suspension 31, to realize a proper vibration characteristic, and 3) properly stopping the liquid conductive adhesive 71, to prevent a short circuit between the common electrode 19 of the piezoelectric element 13 and a conductive part that is present in the vicinity thereof.

According to the first (fifth) example illustrated in FIGS. 6A, 6B, and 6C (11A, 11B, and 11C) of the electrical connecting structure, the annular liquid stopper 69-1 is arranged between the common electrode 19 and the terminal 57A-1 (57B-1) to form a narrow gap (FIG. 6C (11C)) around the through hole 67A (67B). When the liquid conductive adhesive 71 is injected into the through hole 67A (67B), the narrow gap causes a capillary phenomenon to diffuse the adhesive 71 only within the narrow gap.

A space between the terminal 57A-1 (57B-1) and the common electrode 19 out of the liquid stopper 69-1 is wider than the narrow gap, and therefore, causes no capillary phenomenon so that the adhesive 71 never diffuses into the space. Namely, the adhesive 71 does not run over the periphery of the liquid stopper 69-1 and stays under the liquid stopper 69-1. The periphery of the liquid stopper 69-1 acts like a bank to keep the adhesive 71 within the periphery of the liquid stopper 69-1, thereby securing a bonding strength and electric connection between the common electrode 19 of the piezoelectric element 13 and the wire 63A (63B).

The first (fifth) example of the electrical connecting structure, therefore, realizes wiring to the piezoelectric element 13 without damaging the piezoelectric element 13 and improves the reliability thereof.

According to any one of the second and third examples illustrated in FIGS. 7A, 7B, 8A, and 8B of the electrical connecting structure, the terminal 57A-2 (57A-3) has the liquid stopper 69-2 (69-3) consisting of discrete segments between the common electrode 19 and the terminal 57A-2 (57A-3) to form narrow gaps (FIGS. 7B and 8B) around the through hole 67A. The narrow gaps are present in a space between the common electrode 19 and the terminal 57A-2 (57A-3) and are separated by spaces between the adjacent segments 73 (75). When the liquid conductive adhesive 71 is injected into the through hole 67A, the narrow gaps cause a capillary phenomenon to diffuse the adhesive 71 in the narrow gaps.

Similarly, according to any one of the sixth and seventh examples illustrated in FIGS. 12A, 12B, 13A, and 13B of the electrical connecting structure, the terminal 57B-2 (57B-3) has the liquid stopper 69-2 (69-3) consisting of discrete segments between the common electrode 19 and the terminal 57B-2 (57B-3) to form narrow gaps (FIGS. 12B and 13B) around the through hole 67B. The narrow gaps are present in a space between the common electrode 19 and the terminal 57B-2 (57B-3) and are separated by spaces between the adjacent segments 73 (75). When the liquid conductive adhesive 71 is injected into the through hole 67B, the narrow gaps cause a capillary phenomenon to diffuse the adhesive 71 in the narrow gaps.

The space out of the liquid stopper 69-2 (69-3) is wider than the narrow gaps, and therefore, causes no capillary phenomenon so that the adhesive 71 never spreads into the space. Namely, the adhesive 71 does not run over the periphery (indicated with a dotted line 77 in FIGS. 7A and 12A and a dotted line 79 in FIGS. 8A and 13A) of the liquid stopper 69-2 (69-3). The periphery of the liquid stopper 69-2 (69-3) acts like a bank to keep the adhesive 71 within the periphery of the liquid stopper 69-2 (69-3), thereby securing a bonding strength and electric connection between the common electrode 19 of the piezoelectric element 13 and the wire 63A (63B).

The second, third, sixth, and seventh examples, therefore, realize wiring to the piezoelectric element 13 without damaging the piezoelectric element 13 and improve the reliability thereof.

According to the fourth (eighth) example illustrated in FIGS. 9A, 9B, and 9C (14A, 14B, and 14C) of the electrical connecting structure, the annular liquid stopper 69-4 is arranged between the common electrode 19 and the terminal 57A-4 (57B-4), to form a narrow gap (FIG. 9C (14C)). The liquid stopper 69-4 is in contact with the common electrode 19. When the liquid conductive adhesive 71 is injected into the through hole 67A (67B), the narrow gap causes a capillary phenomenon to diffuse the adhesive 71 in the narrow gap. A space between the terminal 57A-4 (57B-4) and the common electrode 19 out of the liquid stopper 69-4 is wider than the narrow gap, and therefore, causes no capillary phenomenon. Accordingly, the adhesive 71 does not penetrate into the space. Namely, the adhesive 71 does not run over the periphery of the annular liquid stopper 69-4, i.e., the annular periphery of the liquid stopper 69-4 acts like a bank to keep the adhesive 71 within the annular periphery of the liquid stopper 69-4, thereby securing a bonding strength and electric connection between the common electrode 19 of the piezoelectric element 13 and the wire 63A (63B).

The fourth (eighth) example, therefore, realizes wiring to the piezoelectric element 13 without damaging the piezoelectric element 13 and improves the reliability thereof.

Operation of the head suspension 31 illustrated in FIGS. 1 to 4 will be explained. It is assumed that the first and second electrodes 15 and 17 of the piezoelectric element 13 are grounded and the common electrode 19 thereof receives a predetermined voltage.

The end face 23 of the first electrode 15 contracts and the end face 25 of the second electrode 17 extends as illustrated in FIG. 2, and therefore, the piezoelectric element 13 deforms into a trapezoid as a whole. Namely, the piezoelectric element 13 minutely moves in the direction Z to move the load beam 35 on the drive side Y in a sway direction (a widthwise direction of the head suspension 31). If the common electrode 19 is grounded and the first and second electrodes 15 and 17 receive a predetermined voltage, the piezoelectric element 13 minutely moves in the direction −Z to move the load beam 35 on the drive side Y in a sway direction.

In this way, the head suspension 31 incorporating the piezoelectric actuator 11 needs three electric systems for the first and second electrodes 15 and 17 and common electrode 19 of the piezoelectric element 13. This configuration makes wiring work to the piezoelectric element 13 easy and reliable.

The base plate 33 accommodates the piezoelectric element 13 and supports the same from below. In addition, the base plate 33 surrounds the piezoelectric element 13 to easily position the piezoelectric element 13 and protect the brittle piezoelectric element 13 from being damaged.

The common electrode 19 and terminal 57 face each other and are connected to each other through a single connection. This configuration reduces the number of wires arranged on the flexure 39 and increases the number of flexures to be produced from a material.

The electrical connecting structure according to the present invention is applicable to a frangible conductive part.

In this case, the electrical connecting structure for a frangible conductive part includes an electrode arranged on the frangible conductive part, a terminal having at least an electric insulating layer and wiring laid on the electric insulating layer, to supply electricity to the electrode, a through hole formed in the terminal through at least the electric insulating layer, a liquid stopper arranged around the through hole, the liquid stopper coming between the electrode and the terminal when the electrode and the terminal are set to face each other with the electric insulating layer being on the frangible conductive part side, and a liquid conductive adhesive injected into the through hole, to electrically connect the electrode of the conductive part and the wiring to each other.

The through hole formed in the terminal may be formed through only the electric insulating layer, or through both the electric insulating layer and the layer of wiring.

The liquid stopper between the electrode and the terminal forms a narrow gap. When the liquid conductive adhesive is injected into the through hole, the narrow gap causes a capillary phenomenon to spread the adhesive in the narrow gap.

A space between the electrode and the terminal out of the liquid stopper is wider than the narrow gap, and therefore, causes no capillary phenomenon so that no adhesive spreads in the space. Namely, the adhesive never diffuses out of the periphery of the liquid stopper. The periphery of the liquid stopper functions as a bank to keep the adhesive within the periphery of the liquid stopper. This secures a bonding strength and electric connection between the electrode of the frangible conductive part and the wiring without applying mechanical stress on the frangible conductive part.

This configuration realizes wiring to the frangible conductive part without damaging the conductive part and improves the reliability thereof.

The present invention is not limited to the embodiments and examples mentioned above. The embodiments and examples are amendable within the technical idea stipulated in the claims and specification without departing from the spirit of the present invention. Electrical connecting structures for piezoelectric elements, piezoelectric actuators, head suspensions, and electrical connecting structures for conductive parts based on such amendments also fall in the scope of the present invention.

For example, an amendment of the present invention allows the flexible parts 41a and 41b and the opening 43 to be formed on the actuator plate 34 instead of the base plate 33. Accordingly, the base or the base plate in the claims conceptually includes the base plate 33 and actuator plate 34. Accordingly, the base or the base plate stipulated in the claims may be read as an actuator plate. For example, the opening formed in the base plate may be read as the opening formed in the actuator plate.

According to the embodiments and examples of the present invention, the piezoelectric actuator 11 is arranged between the base plate 33 and the load beam 35 having the flexure 39. This arrangement does not limit the present invention. In a head moving mechanism that includes a carriage arm and a head suspension fixed to the carriage arm and moves a magnetic head of the head suspension by turning the carriage arm, a piezoelectric actuator employing the electrical connecting structure of the present invention may be arranged between a base and the magnetic head, to minutely move the head suspension, or a magnetic head slider of the head suspension, or a magnetic head element of the same.

Figure 15:
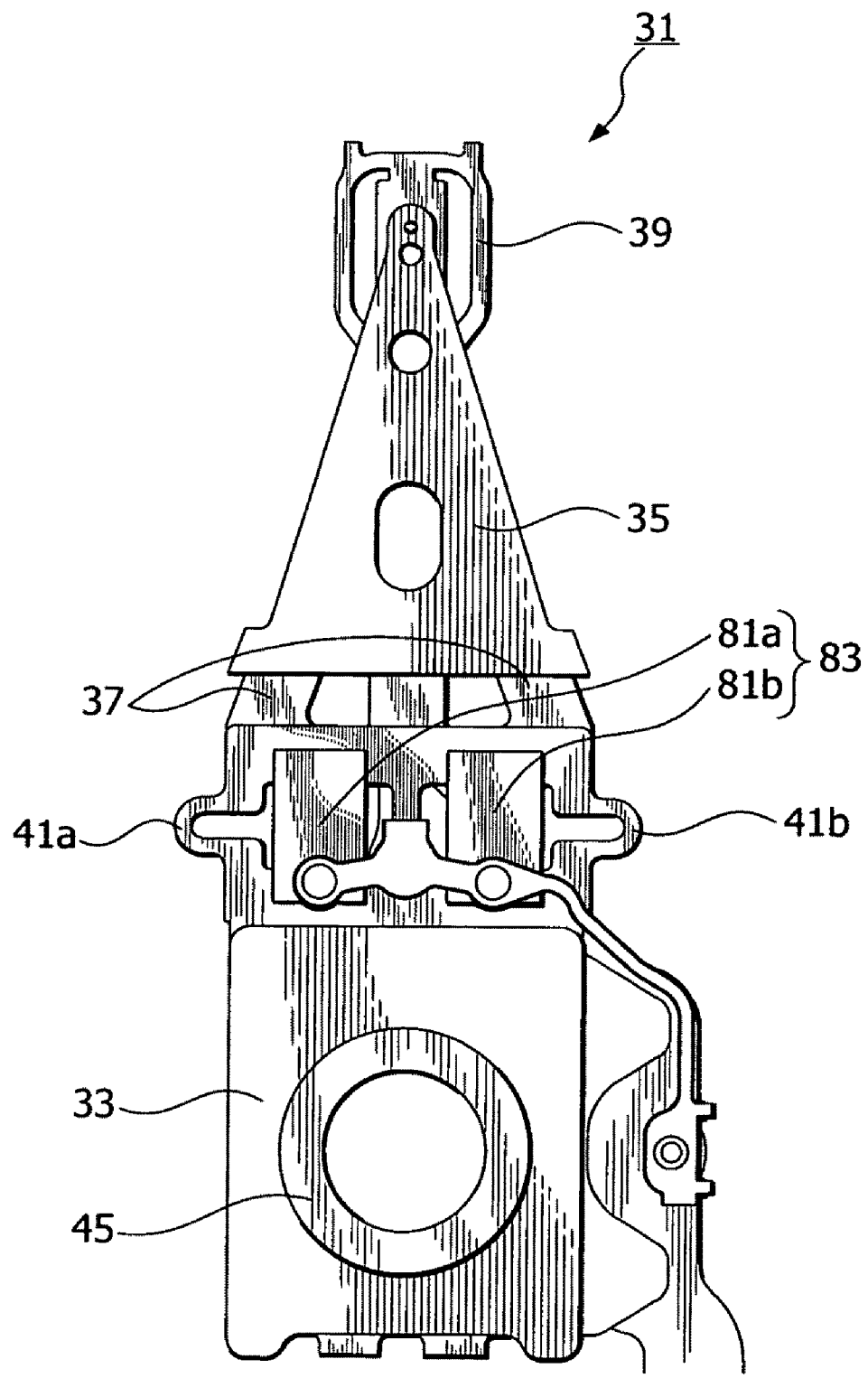
FIG. 15 is a top view illustrating a head suspension according to a modification of the present invention.

According to the embodiments and examples of the present invention, the piezoelectric actuator 11 employs one piezoelectric element 13 to which the electrical connecting structure according to the present invention is applied. This does not limit the present invention. According to a modification of the present invention illustrated in FIG. 15, a piezoelectric actuator 83 employs a pair of piezoelectric elements 81a and 81b and each of the piezoelectric elements 81a and 81b employs the electrical connecting structure of the present invention.

What is claimed is:

1. An electrical connecting structure for a piezoelectric element, the piezoelectric element being incorporated in a piezoelectric actuator that is arranged between a base and a magnetic head and minutely moves the magnetic head in a sway direction according to a deformation of the piezoelectric element, the electrical connecting structure comprising:
    an electrode arranged on the piezoelectric element as part of the piezoelectric actuator;
    a terminal having at least an electric insulating layer and wiring laid on the electric insulating layer, configured to supply electricity to the electrode, wherein the electrode and the terminal face each other with a gap therebetween, the electric insulating layer being on a piezoelectric element side of the terminal;
    an opening through at least the electric insulating layer of the terminal;
    a liquid stopper arranged around the opening between the electrode and the terminal within said gap;
    a liquid conductive adhesive injected into the opening and spanning said gap to provide physical and electrical communication between the electrode and the wiring; and
    wherein the liquid stopper has a size and location for narrowing the gap between the electrode and the terminal without spanning the gap so as to leave a narrowed gap of a size adapted for allowing capillary-type diffusion of the conductive adhesive into the narrowed gap, while stopping diffusion beyond the liquid stopper, when the conductive adhesive is injected into the opening.

2. The electrical connecting structure of claim 1, wherein: the opening is formed in the terminal through the electric insulating layer and the wiring.

3. The electrical connecting structure of claim 1, wherein: the liquid stopper is an annular part formed around the opening so as to come between the electrode and the terminal when the electrode and terminal are set to face each other.

4. The electrical connecting structure of claim 1, wherein: the liquid stopper comprises a plurality of discrete parts formed along the periphery of the opening so as to come between the electrode and the terminal when the electrode and terminal are set to face each other.

5. The electrical connecting structure of claim 4, wherein: the discrete parts that form the liquid stopper are selected from the group consisting of parts radially cut from an annular material, dot-shaped parts, and a combination thereof.

6. The electrical connecting structure of claim 1, wherein: the liquid stopper is a part separated from a conductive base continuous to the terminal and is attached to one of the terminal and the electrode of the piezoelectric element.

7. The electrical connecting structure of claim 1, wherein: the terminal includes a conductive base, the electric insulating layer formed over the conductive base, and the wiring laid on the electric insulating layer; and
    the conductive base is removed by etching in an area of the terminal that faces the electrode of the piezoelectric element.

8. The electrical connecting structure of claim 7, wherein: the liquid stopper is formed by leaving the conductive base around the through hole when removing the conductive base by etching in an area of the terminal that faces the electrode of the piezoelectric element.

9. A piezoelectric actuator comprising the electrical connecting structure of claim 1.

10. A head suspension comprising:
    a base plate;
    a load beam; and
    the piezoelectric actuator of claim 9, configured to minutely move a front end of the load beam in a sway direction.

11. The electrical connecting structure of claim 1, wherein the liquid stopper is a member distinct from the electric insulating layer and wiring of said terminal.

12. The electrical connecting structure of claim 1, wherein the wiring layer is part of wiring member having a conductive base, an insulating layer and the wire layer, the conductive base being etched in the vicinity near the electrode to remove a portion of conductive base, the liquid stopper being a part of the conductive base left in place and located around said opening, the conductive base that forms the liquid stopper being noncontinuous with the conductive base of a remainder of the wiring member so as to avoid a short circuit between the electrode and the conductive base of the remainder of the wiring member.

13. An electrical connecting structure for a conductive part, comprising:
    an electrode arranged on the conductive part that is frangible;
    a terminal having at least an electric insulating layer and wiring laid on the electric insulating layer, configured to supply electricity to the electrode, wherein the electrode and the terminal face each other with a gap therebetween;
    an opening through at least the electric insulating layer of the terminal;
    a liquid stopper arranged around the opening between the electrode and the terminal within said gap;

a liquid conductive adhesive injected into the opening and spanning said gap to provide physical and electrical communication between the electrode and the wiring; and wherein the liquid stopper has a size and location for narrowing the gap between the electrode and the terminal without spanning the gap so as to leave a narrowed gap of a size adapted for allowing capillary-type diffusion of the conductive adhesive into the narrowed gap, while stopping diffusion beyond the liquid stopper, when the conductive adhesive is injected into the opening.

14. The electrical connecting structure of claim 13, wherein:

the opening is formed in the terminal through the electric insulating layer and the wiring.

15. The electrical connecting structure of claim 13, wherein the liquid stopper is a member distinct from the electric insulating layer and wiring of said terminal.

16. The electrical connecting structure of claim 13, wherein the wiring layer is part of wiring member having a conductive base, an insulating layer and the wire layer, the conductive base being etched in the vicinity near the electrode to remove a portion of conductive base, the liquid stopper being a part of the conductive base left in place and located around said opening, the conductive base that forms the liquid stopper being noncontinuous with the conductive base of a remainder of the wiring member so as to avoid a short circuit between the electrode and the conductive base of the remainder of the wiring member.

* * * * *